United States Patent
Olofsson

(10) Patent No.: US 6,913,187 B2
(45) Date of Patent: Jul. 5, 2005

(54) METHOD AND ARRANGEMENT FOR PROVIDING VIAS IN PRINTED CIRCUIT BOARDS

(75) Inventor: Lars-Anders Olofsson, Järfälla (SE)

(73) Assignee: Infineon Technologies Wireless Solutions Sweden AB, Kista (SE)

( * ) Notice: Subject to any disclaimer, the term of this patent is extended or adjusted under 35 U.S.C. 154(b) by 0 days.

(21) Appl. No.: 10/609,955

(22) Filed: Jun. 30, 2003

(65) Prior Publication Data

US 2004/0046006 A1 Mar. 11, 2004

Related U.S. Application Data

(63) Continuation of application No. PCT/SE01/02856, filed on Dec. 19, 2001.

(30) Foreign Application Priority Data

Dec. 29, 2000 (SE) ................................................ 0004894

(51) Int. Cl.$^7$ .......................... B23K 31/00; B23K 1/20; B23K 35/12; B21D 39/00
(52) U.S. Cl. ............... 228/136; 228/173.1; 228/180.22; 228/255; 438/678
(58) Field of Search .......................... 228/122.1, 123.1, 228/136, 173.1, 180.22, 255; 438/678

(56) References Cited

U.S. PATENT DOCUMENTS

| 4,412,642 | A | * | 11/1983 | Fisher, Jr. ................. 228/173.1 |
| 5,465,898 | A | | 11/1995 | Schulz-Harder et al. . 228/122.1 |
| 5,588,207 | A | | 12/1996 | Kawakita et al. ............. 29/852 |
| 5,873,161 | A | | 2/1999 | Chen et al. ................... 29/830 |
| 6,428,328 | B2 | * | 8/2002 | Haba et al. ................... 439/70 |
| 6,638,858 | B2 | * | 10/2003 | Cheng ........................ 438/678 |

FOREIGN PATENT DOCUMENTS

EP 0 299 136 A2 2/1988 ............ H05K/3/40

* cited by examiner

Primary Examiner—Colleen P. Cooke
(74) Attorney, Agent, or Firm—Baker Botts L.L.P.

(57) ABSTRACT

A method of providing thermal vias in a printed circuit board that includes one or more layers of board material is disclosed. The vias provide for conducting heat from components mounted on the board. One or more holes (4) are provided in a printed circuit board that may include several metal layers. A metal ball (6) is inserted into each hole and subjected to pressure such as to deform said ball, and tightly fixating the resultant slug against the wall (5) of said hole. The deformed ball or slug fixed in the hole, which may have a metallised inner surface, functions to conduct heat and/or electricity between a metallised topside (2) and bottom side (3) of the printed circuit board and also between intermediate metallised layers in the case of a multi-layer board.

14 Claims, 2 Drawing Sheets

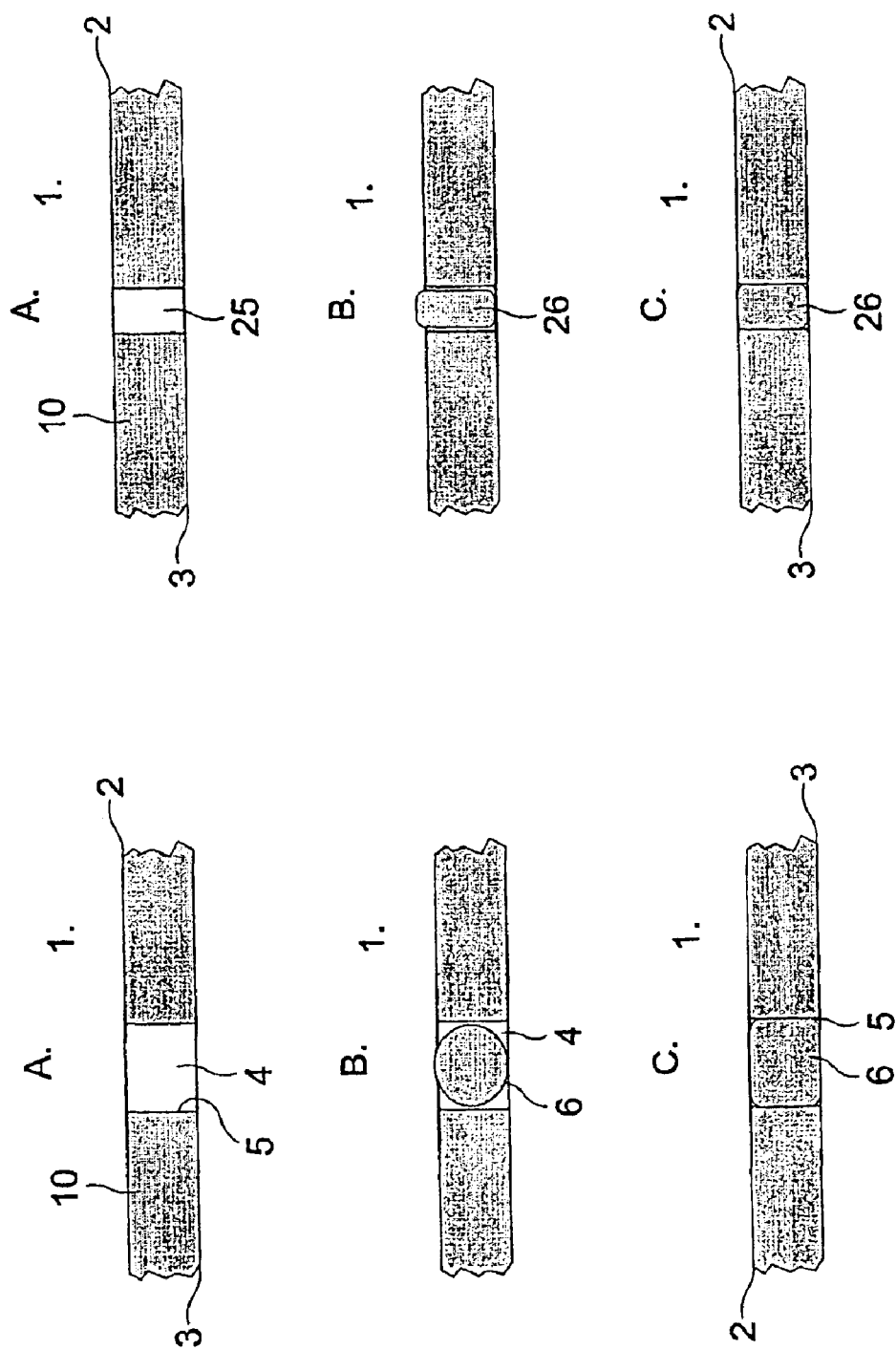

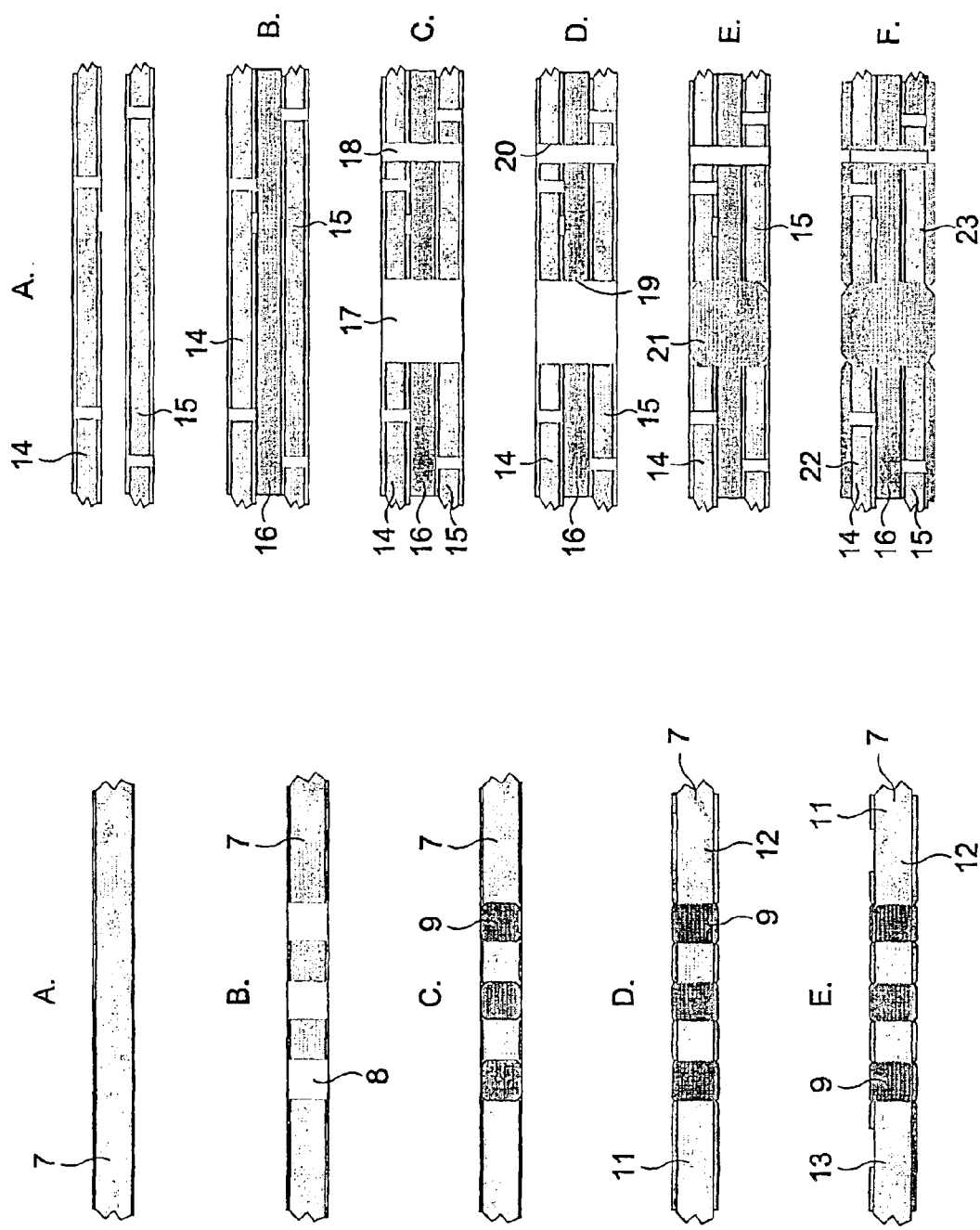

METHOD AND ARRANGEMENT FOR PROVIDING VIAS IN PRINTED CIRCUIT BOARDS

CROSS REFERENCE TO RELATED APPLICATION

This application is a continuation of copending International Application No. PCT/SE01/02856 filed Dec. 19, 2001, and claiming a priority date of Dec. 29, 2000, which designates the United States.

TECHNICAL FIELD

The present invention relates to a method of providing vias in a printed circuit board, and also to a printed circuit board in which vias are arranged in accordance with the method.

BACKGROUND OF THE INVENTION

When surface-soldering power components to a printed circuit board, such as RF power transistors for instance, it is necessary to improve the thermal conductivity of the board with the use of thermal vias. This is because the actual board material, which is often comprised of some kind of polymeric material, has very poor thermal conductivity, whereas metallic material, such as copper, is a very good conductor of heat.

At present, thermal vias are formed by drilling one or more holes in the board material, on the surface to which components are to be soldered. In the following stages of board manufacture, the inner surfaces of respective vias are coated with a thin layer of metallic material, preferably copper. It is essentially this thin copper layer on the inner surface of the holes that conducts heal through the board.

One problem with the present-day production of thermal vias is that the solder used to fasten components to the board penetrates into the holes, therewith diminishing the amount of solder that is effective in securing said components. In addition, solder droplets are formed on the opposite side of the board in relation to said components. These solder droplets are problematic, since they greatly impair the thermal contact between all underside of the board and a cooler, and must therefore be removed at a later stage in some suitable way.

SUMMARY OF THE INVENTION

One object of the present invention is to lighten this problem and to provide improved cooling.

According to a first aspect of the present invention, this object can be achieved with a method of providing vias in printed circuit boards or like structures that comprise one or more layers of board material, comprising the steps of:

forming holes in the layer or layers of board material;
inserting a ball into each hole that is intended to serve as a conductor between different conductive planes on or in the layers of board material;
pressing each ball into a respective hole firmly such as to cause deformation of the ball, such that the outer delimiting surface of the defamed ball will lie in abutment with and in contact with the inner delimiting surface of said hole and its various conductive planes or the inner conductive delimiting surface of said hole.

The ball may serve as a thermal conductor and/or as an earth.

The object can also be achieved by a method of providing vias in printed circuit boards, comprising the steps of:

providing a board material;
drilling at least one hole in said board;
inserting a ball into said hole; and
pressing said ball firmly into said hole, so as to form sand copper vias.

The method may further comprise the step of metallizing the holes and/or the step of plating the topside with copper. The method may further comprise the step of plating the bottom side with copper and/or the step of etching a pattern into said copper layer. The step of providing a board may comprise the steps of:

providing a first board layer and a second board layer, wherein said boards each comprise a pattern etched layer;
laminating said two boards with a pre-preg.

According to a second aspect of the present invention, said object can be achieved with a printed circuit board comprising one or more layers of board material provided with conductor patterns and one or more vias, wherein the printed circuit board has disposed therein one or more holes which extend through said layer or layers;
each hole has provided therein an electrically and/or thermally conductive and deformed ball which has been deformed in said hole subsequent to having been inserted and pressed firmly therein, wherewith said deformed balls seal against and are fixated by essentially the inner delimiting surface of said hole.

The balls can be made of copper. The printed circuit board may further comprise a metal layer on the topside and/or the bottom side of said board, said layer covering the ends of the deformed balls.

One advantage afforded by the present invention is that the printed circuit boards have a much lower thermal resistance from one upper side to an underside of said boards in comparison with boards manufactured in accordance with the present standpoint of techniques.

Another advantage afforded by the present invention is that probing of the vias is made easier when they are fully closed.

A further advantage afforded by the present invention is that it allows the power components to be surface-mounted at the same time as all other components are surface-mounted on the board, therewith greatly reducing costs in comparison with traditional mounting processes.

Yet another advantage of the present invention is that a cooler or chassis need not fulfil the same high requirements with respect to surface flatness, since components, such as RF power transistors, can be surface-mounted directly on the printed circuit board by soldering processes.

The invention will now be described in more detail with reference to preferred embodiments and also with reference to the accompanying drawings.

BRIEF DESCRIPTION OF THE DRAWINGS

FIGS. 1A–C illustrate the insertion of a copper ball into a hole in a printed circuit board and the deformation of said ball under pressure, in accordance with the invention.

FIGS. 2A–E illustrate the insertion of several copper balls into holes in a printed circuit board and the deformation of said balls under pressure to form vias in accordance with the invention, and also show plating and etching of patterns on the printed circuit board.

FIGS. 3A–F illustrate the insertion of a copper ball in a hole in a multi-layer printed circuit board and the deformation of said ball under pressure to form a via in accordance with the invention, and also show plating and etching of patterns in the top layers.

FIGS. 4A–C illustrate the insertion of an elongate copper body in a narrow hole in a. printed circuit board and the deformation of said body under pressure, such as to form a via in accordance with the invention.

DESCRIPTION OF THE PREFERRED EMBODIMENTS

FIG. 1A is a cross-sectional view of a board 1 for the manufacture of a printed circuit board. The board 1 comprises board material 10 that includes a metallised topside 2 and a metallised bottom side 3. These metallised sides form a basis for conductor patterns. Conductor patterns are etched from the electrically conductive topside and bottom side in accordance with methods which are well known to the person skilled in this technical field and which therefore need not be described in more detail here. The board material may be any suitable commercially available material, such as FR4 or BT. The board includes a hole 4 that has a metallised outer surface 5 which is in contact with the metallised topside and bottom side of said board.

FIG. 1B is a cross-sectional view of the board 1, showing a metal ball 6, e.g. a copper ball, inserted in the hole 4. Copper balls can be inserted into holes in printed circuit boards more easily than cylindrical copper bodies and can be made in all conceivable sizes, with a tolerance of +/−20 micrometers.

FIG. 1C shows the hole 4 practically filled completely as a result of deforming the copper ball 6 in said hole under pressure wherewith metallic contact is achieved between the outer surface of the deformed ball and the metallised outer surface 5 of the hole 4. The deformed copper ball in the metallised hole enables heat, and possibly electricity, to be conducted from the metallised topside 2 to the metallised bottom side 3 of the board.

FIG. 2A illustrates part of a non-perforated or imperforate board material 7.

FIG. 2B shows the board material of FIG. 2A in which three holes 8 have been drilled. These holes may have been metallised.

FIG. 2C shows how balls 9 have been inserted into respective holes and pressed firmly and deformed therein, so as to form sand copper vias.

FIG. 2D illustrates a copper plated topside 11 and bottom side 12 of said board material, wherewith the end surfaces of the solid copper vias, i.e. the deformed balls 9, have also been covered by the copper layer.

FIG. 2E illustrates patterns 13 etched on the topside of the board material 7.

FIG. 3A is a cross-sectional view of part of two board layers 14 and 15, said layers having been pattern-etched separately.

FIG. 3B shows how the two board layers 14, 15 have been laminated with a pre-preg 16.

FIG. 3C shows via holes 17 and cooling holes 18 that have been drilled through the composite structure 14–16, FIG. 3D shows the drilled holes provided with metallised inwardly lying layers 19 and 20, which may be of the so-called copper coating type.

FIG. 3E illustrates a solid copper via in the multi-layer printed circuit board, said via having been formed by inserting a copper ball 21 into said hole and subjecting the ball to pressure to form a plug/via.

FIG. 3F shows the printed circuit board plated with copper, wherein a copper layer 22 and 23 also covers the end surfaces of the plug/copper via. Patterns can then be etched in the top layers on the topside and the bottom side of the board in accordance with conventional methods.

FIG. 4A is a cross-sectional view of an alternative embodiment of a printed circuit board 1 that includes a metallised top side 2; a metallised bottom side 3 and a hole 25 which is narrow in relation to board thickness such narrow holes possibly being necessary in certain via applications.

FIG. 4B shows the board of FIG. 4A with an elongated ball 26 inserted in the hole 25; it is necessary to stretch the ball in order for the ball to :6.t in the narrow hole and fill-out the hole cavity with an optionally metallised inner surface. Generally speaking, it is always necessary to adapt the ball diameter to the hole diameter and to the board thickness.

FIG. 4C shows how the elongated ball 26 has been subjected to pressure and deformed in the hole such as to essentially fill the entire hole cavity.

The metallic plugs are formed by deformed metallic balls pressed firmly into holes in the board material, so as to :fill the hole cavities practically completely. The balls will fill the hole in a direction orthogonal to the longitudinal direction of the holes and, as they are pressurized, expand into contact with practically the whole of the inner wall of said hole, therewith providing good metallic contact between the resultant solid copper vias and the existing metallised hole walls.

Although the illustrated embodiments of the printed circuit boards provided with vias are of a single-layer type and a multi-layer type that includes two board layers, it will be understood that the present invention can also be applied with boards that have more layers than two, wherewith the copper plugs are able to function as thermal vias between a topside and a bottom side of the board and between the different metallic layers, and can also function as earth connections between the different metallic layers per se.

It will also be understood that the invention is not restricted to the aforedescribed and illustrated exemplifying embodiments thereof and that modifications can be made within the scope of the accompanying claims.

I claim:

1. A method of providing vias in printed circuit boards or like structures that comprise one or more layers of board material, comprising the steps of:

forming holes in the layer or layers of board material;

inserting a ball into each hole that is intended to serve as a conductor between different conductive planes on or in the layers of board material;

pressing each ball into a respective hole firmly such as to cause deformation of the ball, such that the outer delimiting surface of the defamed ball will lie in abutment with and in contact with the inner delimiting surface of said hole and its various conductive planes or the inner conductive delimiting surface of said hole.

2. The method according to claim 1, wherein the ball serves as a thermal conductor.

3. The method according to claim 1, wherein the ball serves as an earth.

4. A printed circuit board comprising one or more layers of board material provided with conductor patterns and one or more vias, wherein the printed circuit board has disposed therein one or more holes which extend through said layer or layers;

each hole has provided therein an electrically and/or thermally conductive and deformed ball which has been deformed in said hole subsequent to having been inserted and pressed firmly therein, wherewith said deformed balls seal against and are fixated by essentially the inner delimiting surface of said hole.

5. A printed circuit board according to claim 4, wherein the balls are made of copper.

6. A printed circuit board according to claim 4, further comprising a metal layer on the topside of said board, said layer covering the ends of the deformed balls.

7. A printed circuit board according to claim 4, further comprising a metal layer on the bottom side of said board, said layer covering the ends of the deformed balls.

8. A printed circuit board according to claim 4, further comprising a metal layer on the topside and bottom side of said board, said layer covering the ends of the deformed balls.

9. A method of providing vias in printed circuit boards, comprising the steps of:

providing a board material;

drilling at least one hole in said board;

inserting a ball into said hole; and pressing said ball firmly into said hole, so as to form sand copper vias.

10. The method according to claim 9, further comprising the step of metallizing the holes.

11. The method according to claim 9, further comprising the step of plating the topside with copper.

12. The method according to claim 9, further comprising the step of plating the bottom side with copper.

13. The method according to claim 11, further comprising the step of etching a pattern into said copper layer.

14. The method according to claim 9, wherein the step of providing a board comprises the steps of:

providing a first board layer and a second board layer, wherein said boards each comprise a pattern etched layer;

laminating said two boards with a pre-preg.

* * * * *